(12) United States Patent
Putnam et al.

(10) Patent No.: US 7,788,069 B2
(45) Date of Patent: Aug. 31, 2010

(54) SYSTEM AND METHOD FOR GENERATING GRADING TRANSITIONS

(75) Inventors: Chris Putnam, Manchester, NH (US); Mark W. Anderson, Manchester, NH (US)

(73) Assignee: AUTODESK, Inc., San Rafael, CA (US)

( * ) Notice: Subject to any disclaimer, the term of this patent is extended or adjusted under 35 U.S.C. 154(b) by 795 days.

(21) Appl. No.: 11/668,938

(22) Filed: Jan. 30, 2007

(65) Prior Publication Data

US 2008/0183434 A1 Jul. 31, 2008

(51) Int. Cl.
*G06F 17/50* (2006.01)
(52) U.S. Cl. .......................................................... 703/1
(58) Field of Classification Search ................... 703/1
See application file for complete search history.

(56) References Cited

OTHER PUBLICATIONS

B.B. Govorkov, "Cherenkov detectors in Cherenkov's laboratory", Sep. 2005, Nuclear Intruments and Methods in Physics Research A, vol. 553, pp. 9-17.*
Richard S. Shevell, "Fundamentals of flight", second edition, 1989, Prentice Hall, p. 208.*
Highway Design Guide National Standards, "Vertical Alignment", Dec. 2004, pp. 4-1-4-27.*
Highway Design Guide National Standards, "Horizontal Alignment", Dec. 2004, pp. 5-1-5-33.*
Colorado Department of Transportation, "COGO User Guide and Command Reference", 2002, pp. 1-163.*
Nicholas J. Garber et al., "Traffic and highway engineering", second edition, 1997, PWS Publishing Company, pp. 645-646.*
Steve Schweitzer, "Sweeping Along a Trajectory", 2001, http://www.prodesktop.net/sweep/sweep.htm, pp. 1-3.*
Autodesk, Inc., Autodesk Civil 3D. 2005. Getting Started. Manual. 23702-010000-5000A. Sep. 2004. Entire Document.
Land Desktop, Creating Composite Grading Objects, Manual. Nov. 2004, pp. 1-11.
International Search Report. Jul. 7, 2008.

\* cited by examiner

*Primary Examiner*—Paul L Rodriguez
*Assistant Examiner*—Russ Guill
(74) *Attorney, Agent, or Firm*—Patterson & Sheridan, LLP

(57) ABSTRACT

Embodiments of the invention include a method for generating a three-dimensional (3D) model of a grading transition. Advantageously, the method for generating a 3D model of a grading transition may be used to generate generating a CAD drawing that includes realistic grading transitions, both in terms of a visual appearance and in terms of volumetric calculations related to the excavation/fill of grading materials.

22 Claims, 6 Drawing Sheets

SYSTEM AND METHOD FOR GENERATING GRADING TRANSITIONS

BACKGROUND OF THE INVENTION

1. Field of the Invention

The present invention generally relates to computer software. More specifically, the present invention relates to a method and system for generating slope grading transitions in CAD drawings.

2. Description of the Related Art

The term computer-aided design (CAD) generally refers to a broad variety of computer-based tools used by architects, engineers, and other construction and design professionals. Civil engineers frequently use CAD applications to compose design drawings for engineering projects. The design drawings typically provide both two-dimensional (2D) and three-dimensional (3D) representations of a construction project integrated with a digital terrain model. For example, the design drawings may provide a 3D model of a roadway, a parking lot, or a retention pond, to name but a few examples.

One common design requirement for these types of civil engineering projects is referred to as site grading. Generally, "grading" is the process of excavating or building-up grading material and is usually associated with construction foundations, roads, parking lots, etc. Accurate CAD modeling of grading surfaces and volumes is an important issue for civil engineering projects because the cost of hauling away or bringing-in grading materials can be a major expense. Further, improperly graded surfaces may lead to premature failure for elements of a civil engineering project. For example, an improperly graded surface for a roadway may lead to the roadway being washed away over time by surface runoff. Thus, accurately representing both the shape and volume of the grading in a CAD drawing is an important design requirement.

Historically, 2D CAD applications were only able to provide crude approximation tools for estimating the grading requirements of 3D volumes. More recently, CAD applications have been made available that can generate 3D models. Such CAD applications often include tools for modeling grading shapes and volumes using 3D solids. To generate a model of a graded area, the tools typically generate surfaces using a set of overlapping polygons. In a number of common scenarios, however, this can lead to an inaccurate 3D geometry for a graded area. Further, because the geometry of the graded area is inaccurate, any calculations of the 3D volume of the graded area tend to be inaccurate as well.

One common scenario where prior art CAD applications fail to develop an accurate grading model arise when the CAD application is used to create a grading model for a grading transition. A grading transition is where the grading criteria for a graded region transition from one set to another. Grading criteria typically specify a required slope for a graded surface that extends for a specified distance from a given feature line. Using this approach, a set of polygons may be generated by connecting perpendicular lines extending from either end of the feature line. With the overlapping set of polygons, a "daylight line" representing the end of the graded surface may be defined. However, with this approach, if the feature line has a bend, then the daylight line usually is not able to generate an accurate 3D geometry of the graded area or an accurate 3D volume for the graded area (particularly where there are multiple grading criteria moving up or down the feature line). This occurs because the grading distance from the feature line may be measured two different ways, depending on which segment of the feature line is used.

Another drawback of this approach is that on the outside bend of the daylight line this leads to a discontinuous shape for the daylight line that has traditionally been connected with an additional line segment. On the inside bend, this approach leads to a jagged appearance for a portion of the daylight line, where representing how material is actually graded requires a smooth transition. Thus, simply using overlapping polygons to generate a grading transition leads to a poor 3D model, limiting the usefulness of fill/excavation calculations generated therefrom.

Other methods for calculating an approximate grading volumes and daylights are available. For example, samples may be taken at a regular interval along the footprint at the given slope/distance criteria. The daylight is formed by connecting the endpoints of the sample lines, and volumes are calculated by estimating the volume between two adjacent samples. Using this approach, however, the daylight line can have a number of undesirable properties. For example, a daylight line calculated using this approach may intersect with itself. Moreover, the accuracy depends on the number of samples taken.

Accordingly, there is a need in the art for improved techniques for representing the shape and volume of grading transitions for civil engineering projects using a CAD application.

SUMMARY OF THE INVENTION

Embodiments of the invention include a method for generating a three-dimensional (3D) model of a grading transition. The method includes receiving grading transition data that specifies a footprint, an initial grading distance, and an ending grading distance. Using the grading transition data, a grading distance transition may be determined. The method also includes generating a daylight line by sweeping a circle along the footprint. As the circle traverses the footprint, the radius of the circle may be increased according to the grading distance transition rate. Once the daylight line is generated elevation values may be assigned to stations along the daylight line using the grading transition data. Additionally, if the footprint includes a bending point, then adjacent segments of the daylight line along an outside corner may be filleted to produce a smooth daylight line from the footprint. Similarly, adjacent segments of the daylight line along an inside corner may be extended to an intersecting point in order to generate smooth daylight line from the footprint.

A grading transition may specify a transition from a first set of grading criteria to a second set; typically, a change in the distance which to grade a surface from the footprint. Embodiments of the invention allow a designer to use a CAD application to generate a realistic 3D model that represents real-world graded surfaces. Further, the 3D model of a graded surface may be used to generate accurate calculations related to the elevation of the daylight line, as well as to fill/excavation requirements.

BRIEF DESCRIPTION OF THE DRAWINGS

So that the manner in which embodiments of the present invention may be understood in detail, a more detailed description of the invention, briefly summarized above, may be had by reference to the appended drawings. These drawings, however, illustrate typical embodiments of the invention and are not meant to be limiting of its scope, for the invention may admit to other equally effective embodiments.

DETAILED DESCRIPTION OF THE PREFERRED EMBODIMENTS

Embodiments of the invention generally relate to computer software applications used for developing a 3D model of grading transitions in a CAD drawing. A grading transition may specify a transition from a first set of grading criteria to a second set. Typically, a grading transition specifies a change in the perpendicular distance for grading a surface from a specified feature line in a CAD drawing. The feature line is commonly referred to as a footprint. Also, the resulting line defined by the graded distance from the footprint is commonly referred to as the daylight line for the graded region. The daylight line represents a line of zero cut or fill within the job area, i.e., where the graded surface intersects the existing ground of a digital terrain model. Embodiments of the invention allow a designer to use a CAD application to generate smooth daylight lines associated with a grading transition. Further, embodiments of the invention may be used to calculate the elevation of the daylight line, as well as determine regions of the graded surface where fill material will need to be excavated or added in order to confirm with the grading requirements, including an accurate calculation of these requirements through a grading transition.

Figure 1:
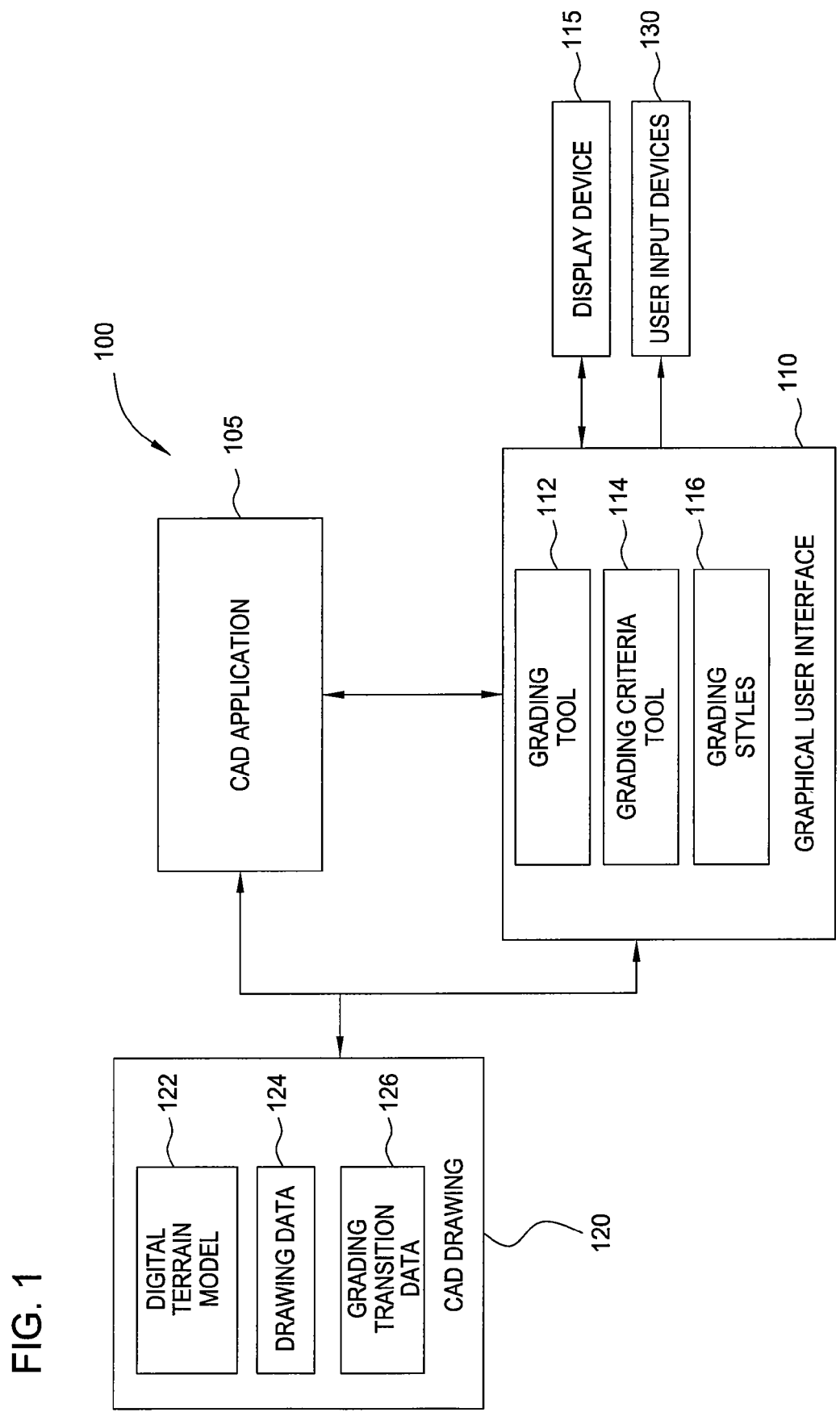
FIG. 1 is a functional block diagram illustrating a system for generating grading transitions in a CAD drawing, according to one embodiment of the invention.

FIG. 1 is a block diagram illustrating components of a system 100 used to develop a grading transition for a CAD drawing, according to one embodiment of the invention. The hardware components illustrated in system 100 are included to be representative of existing computer systems, e.g., desktop computers, server computers, laptop computers, tablet computers, and the like. The software applications described herein; however, are not limited to any particular computing system and may be adapted to take advantage of new computing systems as they become available.

Additionally, the software applications illustrated in system 100 may be implemented to execute on a single computer system or on distributed systems communicating over computer networks such as local area networks or large, wide area networks, such as the Internet. For example, a graphical user interface 110 may include a software program executing on a client computer system at one physical location communicating with CAD application 105 at another physical location. Also, in one embodiment, CAD application 105 and graphical user interface 110 may be provided as an application program (or programs) stored on computer readable media such as a CD-ROM, DVD-ROM, flash memory module, or other tangible storage media.

As shown, the system 100 includes, without limitation, CAD application 105, graphical user interface 110, a CAD drawing 120, user input devices 130, and a display device 115. CAD application 105 may be configured to allow users interacting with GUI 110 to compose a CAD drawing 120. Accordingly, CAD application 105 and GUI 110 may include programmed routines or instructions allowing users to create, edit, load, and save CAD drawing 120. In one embodiment, the Autodesk® Civl3D™ application program (and associated utilities) may be used. Those skilled in the art will recognize that the components shown in FIG. 1 are simplified to highlight aspects of the present invention and that a typical CAD application 105 and GUI 110 may include a broad variety of additional tools and features used to compose and manage CAD drawing 120.

Illustratively, CAD drawing 120 includes a digital terrain model DTM 122, CAD drawing data 124, and grading transition data 126. As is known, DTM 122 provides a topographic model of the bare earth that can be manipulated by CAD application 105. Typically, the topographic model is of a location where some sort of structure, such as a road, parking lot, etc, is to be built. Drawing data 124 includes the 2D and 3D sketches composed for a given CAD drawing 120. For example, common drawing elements include points, lines, polylines, arcs, etc. Additionally, drawing data 124 may include a variety of metadata regarding elements of a particular CAD drawing 120 such as materials, feature lines, grading requirements, volume requirements, and the like. Thus drawing data 124 may include raw lines, arcs, circles, as well as collections of these primitive drawing elements used to represent elements of the real-world object being modeled by CAD drawing 120.

Grading transition data 126 may specify the criteria used to develop a grading transition for a specified feature line. As stated, the grading criteria may be expressed as a minimum distance a graded surface should extend from a feature line, typically designated as the grading transition "footprint," at any point along the feature line. Grading transition data 126 may also specify the slope at which the surface should graded from the footprint for the specified distance. When the distance changes, that is, when a grading transition occurs, grading transition data 126 may include a beginning distance at one point along the footprint at which to begin the grading transition and an grading distance for the a second point along the feature line at which the grading transition should be completed.

In one embodiment, GUI 110 allows users to compose and edit a CAD drawing 120. For example, the Civil 3D™ application provides is used by designers and engineers to compose and edit civil engineering drawings. Also as shown, GUI 110 includes a transition grading tool 112, a grading criteria tool 114 and, optionally, one or more grading styles 116.

Transition grading tool 112 may be configured to generate a grading transition that conforms to grading criteria specified by grading transition data 126. In one embodiment, the GUI 110 may be configured to generate and display a smooth daylight line for a grading transition. Generally, the grading transition generated by transition grading tool 112 reflects what would actually be graded by machinery, and may be used to generate volume calculations for use in subsequent calculations related to fill/excavation of grading materials. As described herein, the generated volume calculations are more accurate than those produced by prior art systems and techniques.

Additionally, as the same grading criteria may be used for many different footprints of a CAD drawing, a set of grading criteria may be saved and reused as one of grading styles 116. For example, a grading style appropriate for a two-lane road might specify to grade at a slope of 2% from the centerline of the road for 20 feet on either side. Similarly, a grading style for a larger road might specify a grade of 1.8%, for 50 feet on either side. Both of these, and other, grading criteria may be stored as one of available grading styles 110. The actual grading criteria used by a given CAD drawing 120 may be stored as part of drawing data 124. Additionally, where the grading style needs to be transitioned from one set of criteria to another, grading tool 112 may be invoked to generate grading transition using grading transition data 126.

As stated, grading transition data 126 may specify the grading criteria to use at the beginning and ending of a grading transition. In one embodiment, grading transition data 126 may be entered by a user interacting with GUI 110 using grading transition criteria tool 114. Alternatively, the input data 126 may be provided by other data sources (e.g., files, database records, and the like), and accessed by CAD application 105.

Figure 2:
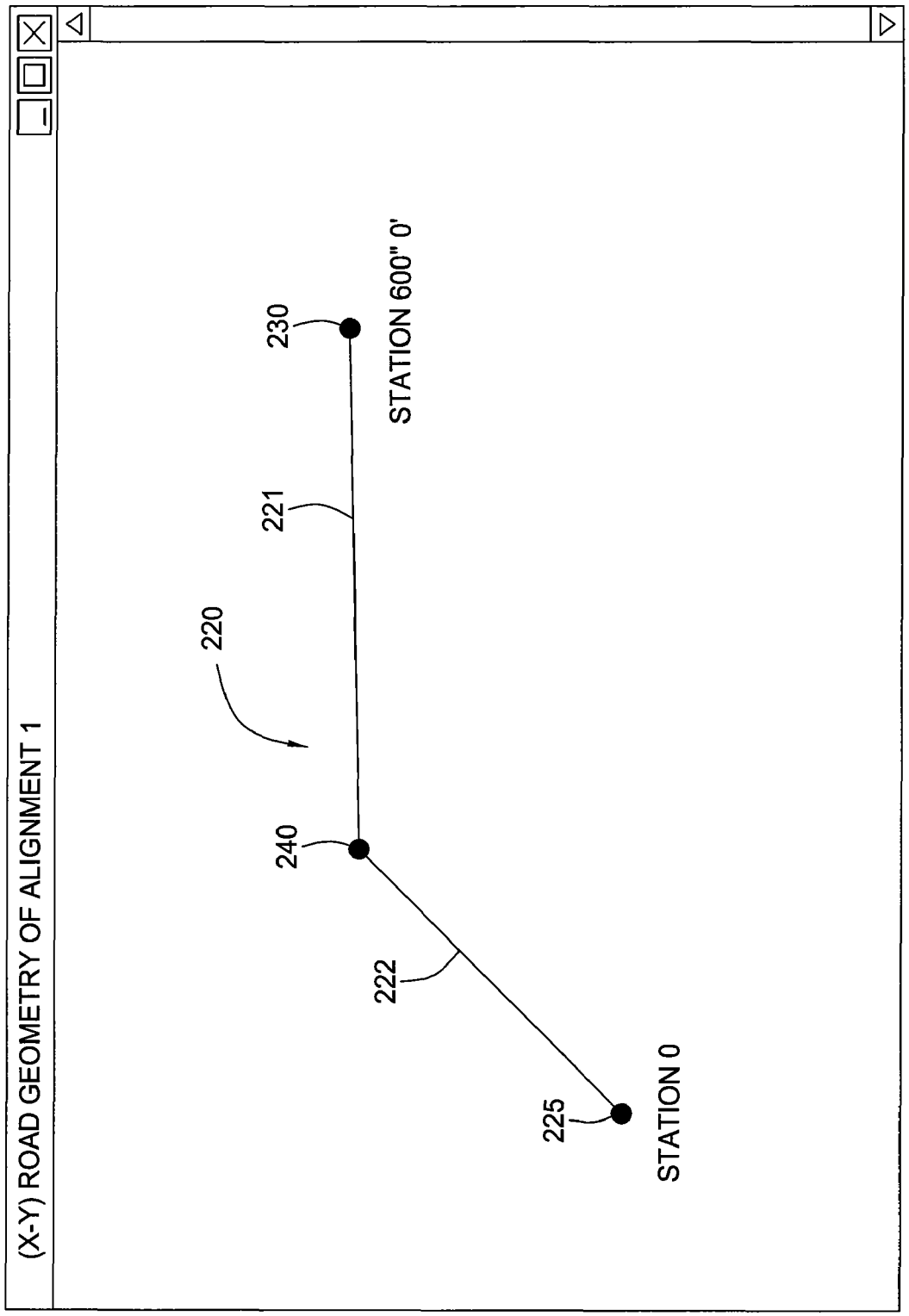
FIG. 2 illustrates a graphical representation of an example feature line used to generate a grading transition in a CAD drawing, according to one embodiment of the invention.

FIGS. 2-5 illustrate a grading transition generated for an example footprint, according to one embodiment of the invention. FIG. 2 is an example portion of a CAD drawing 120. More specifically, FIG. 2 shows a plan view illustrating a footprint 220 that includes a beginning station 225 and an ending station 230. Together, beginning station 225 and an ending station 230 indicate a total length of 600 feet for footprint 220. Generally, the station values provide a convenient way to specify locations along footprint 220. Additionally, footprint 220 includes a footprint segment 221 and a footprint segment 222 connected at a bend point 240. For this example it is assumed that footprint 220 represents a feature line to use in generating a grading transition, in particular, a transition in the distance at which to grade a surface along a bending roadway.

Figure 3A:
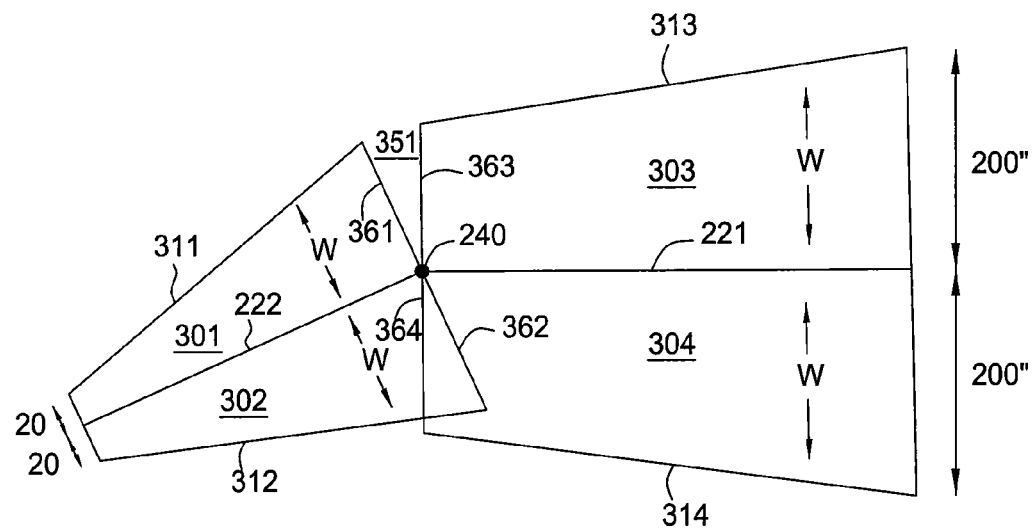
FIGS. 3A-3B illustrate examples of a grading transition generated for the feature line shown first shown in FIG. 2, according to one embodiment of the invention.

FIG. 3A illustrates a grading transition generated for footprint 220. Footprint segment 221 and footprint segment 222 are shown along with bend 240. Daylight lines 311-314 represent the distance which the graded surface extends from the footprint segments 221 and 222 as the grading distance is transitioned from an initial distance of 20' (i.e., 20 feet beginning at station 225) to a final distance of 200' (i.e., 200 feet at ending station 230) on either side of footprint 220. By increasing the distance over which the surface is graded at a constant rate along the stations of footprint segments 221 and 222, the grading transition may be generated. As shown, daylight lines 311 and 312 are generated for footprint segment 222. Similarly, daylight lines 313 and 314 are generated for footprint segment 221.

As stated, prior art techniques typically generate a grading transition by creating a set of overlapping polygons; in this case, the polygons of tiles 301-304 formed by connecting daylight lines 311-314 with the beginning and ending points of segments 222 and 221. However, at bend point 240, the grading transition generated using overlapping polygons of tiles 301-304 is ambiguous. For example, the grading surface is not well defined in region 351 (bounded by lines 361 and 363), because daylight lines 311 and 313 are disconnected region 351 is not covered by either of tiles 301 or 303. Similarly, overlap between tiles 302 and 304 results in a jagged edge 362 in the transition from daylight line 312 to 314. As previously described herein, such areas of uncertainty in a 3D model cause inaccurate volume calculations of the amount of dirt to be removed or brought to the region, the amount of asphalt needed to construct the roadway, and the like. Such inaccuracies may prove to be costly because the transport of dirt, asphalt and other materials may be very expensive.

Accordingly, embodiments of the invention may be used to create smooth daylight lines associated with segments of a bending footprint line. For example, in some embodiments, rather than simply generate a set of overlapping polygons, a circle with an increasing radius may be swept along footprint 220 to generate smooth daylight lines along the full length of footprint 220, including smooth transitions both above and below bend point 240. Additionally, in a particular embodiment, the area above bend point 240 (the outside corner) may be filleted to produce a smooth connection between daylight lines 311 and 313. And the area below bend point 240 formed at the overlap of edges 362 and 364 (the inside corner) may be connected by extending daylight line 314 to intersect with daylight line 312.

Figure 3B:
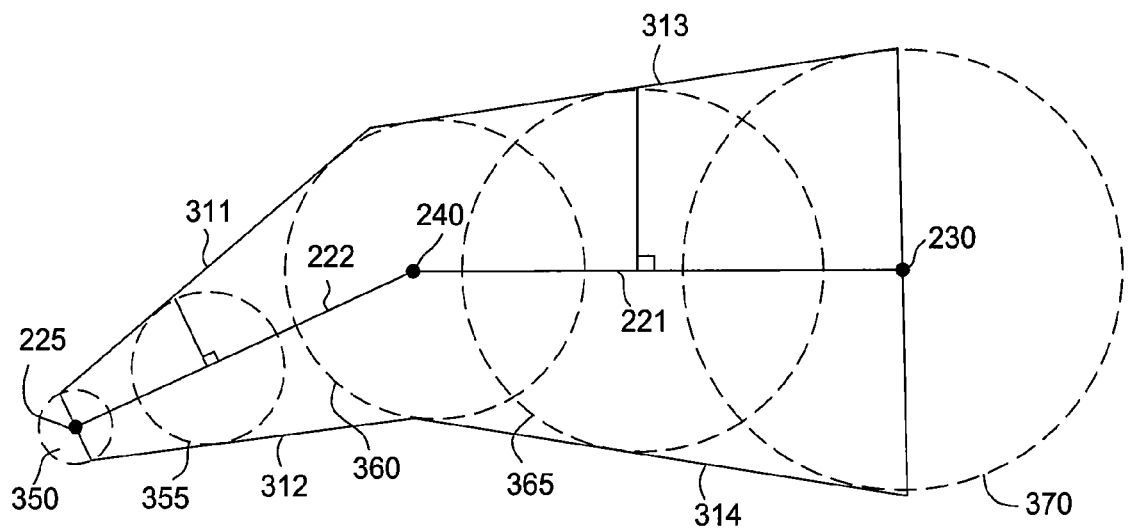

FIG. 3B illustrates a grading transition generated by sweeping a circle of increasing radius along footprint 220, according to one embodiment of the invention. As shown, an initial circle 350 with a radius of 20' feet is placed with the center at beginning station 225. The initial radius of 20' feet corresponds to the initial grading distance. Initial circle 350 is then swept along footprint segment 222. As initial circle 350 is swept along footprint segment 222, the radius is increased at a rate such that when the circle reaches ending station 230, the radius of an ending circle 370 matches the ending grading distance of 200" feet on either side of footprint 220. Intermediate circles 355, 360 and 365, show the circle as the radius increases as it is swept along the footprint 220. At each station along the footprint 220, the daylight line may be defined using the point on the circle using a radius perpendicular to the footprint 220.

Additionally, in one embodiment, when the circle reaches bend point 240, the shape of the daylight lines may be modified to further smooth out the transition of the grading transition from one segment of a footprint to another.

Figure 4:
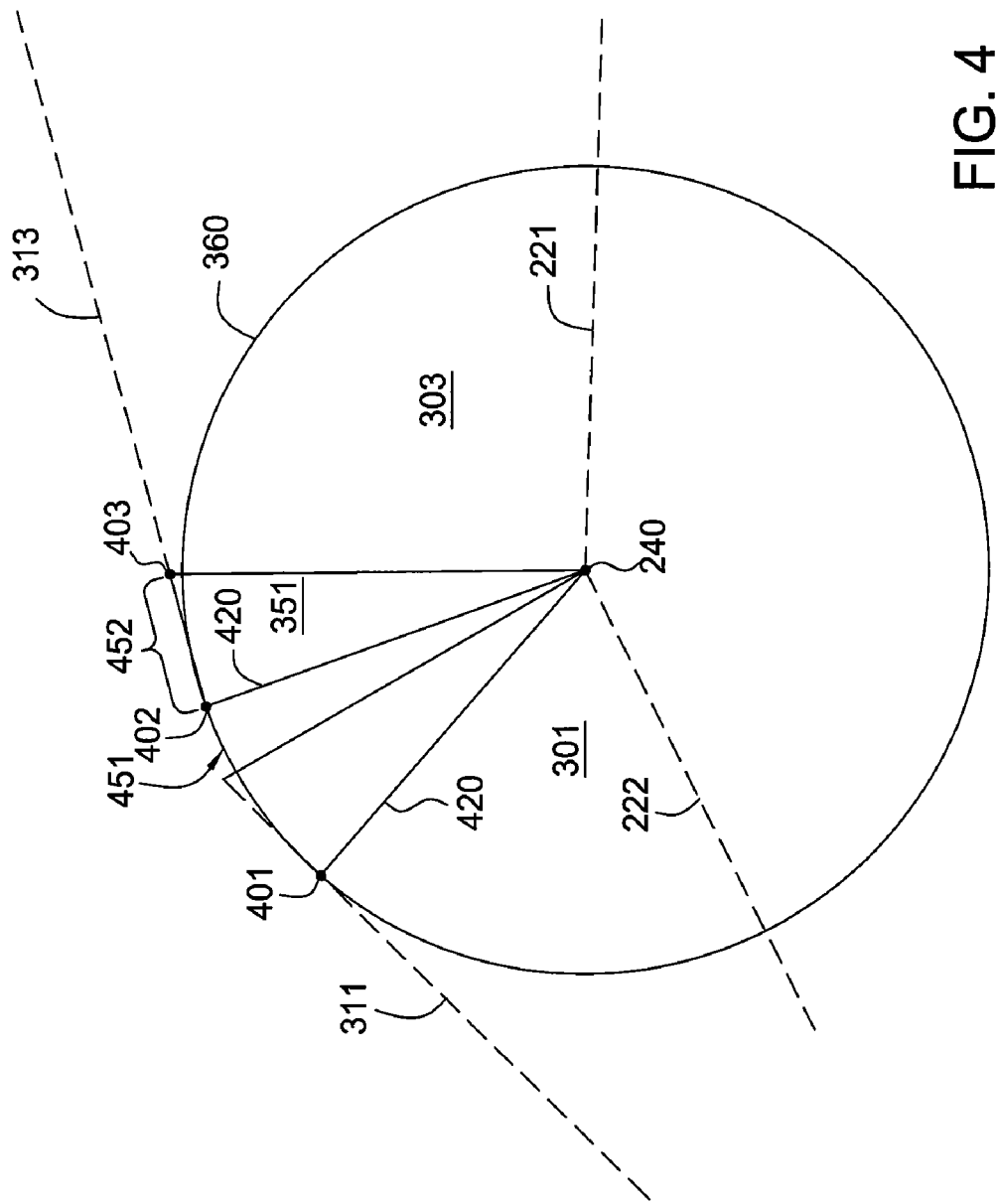
FIG. 4 illustrates the connection of two daylight lines along an outside corner, according to one embodiment of the invention.

FIG. 4 illustrates a portion of the grading transition of FIGS. 2-3, according to one embodiment of the invention. Specifically, daylight lines 311 and 313 of FIG. 3A are shown as well as tiles 301 and 303 using dashed borders. In one embodiment, a daylight line generated for a grading transition may be filleted to produce a smooth transition between the endpoints of two segments of the daylight line. Generally, filleting is a technique used by a CAD application to generate an arc connecting endpoints of two intersecting lines to produce a rounded corner. The daylight lines may be extended as needed so that the endpoints of the daylight lines are tangent to a circle centered on a bend point of the footprint. The tangent endpoints may then be filleted to create a smooth connection. Determining the geometry of the daylight lines this way more accurately reflects what would actually be graded by for a grading transition. Further, when displayed as part of a CAD drawing, generating the daylight lines in this fashion provides a more realistic view of the grading transition.

For example, FIG. 4 shows a fillet 451 generated to connect daylight lines 311 and 313. As illustrated, daylight line 313 is extended from point 403 to point 402 (line segment 452) to make a tangent connection with circle 360. At point 401, circle 360 is tangent to the endpoint of daylight line 311. Thus, the grading distance at both point 401 and point 402 is equal to the radius 420 of circle 360 centered at bend point 240. Similarly, the points 401 and 402 may be filleted to produce a smooth curve connecting points 401 and 402. Accordingly, the portion of the arc between points 401 and 402, i.e., fillet 451, and the extended line segment 452 of daylight line 313 between points 402 and 403 define the daylight for this exemplary grading transition.

Figure 5A:
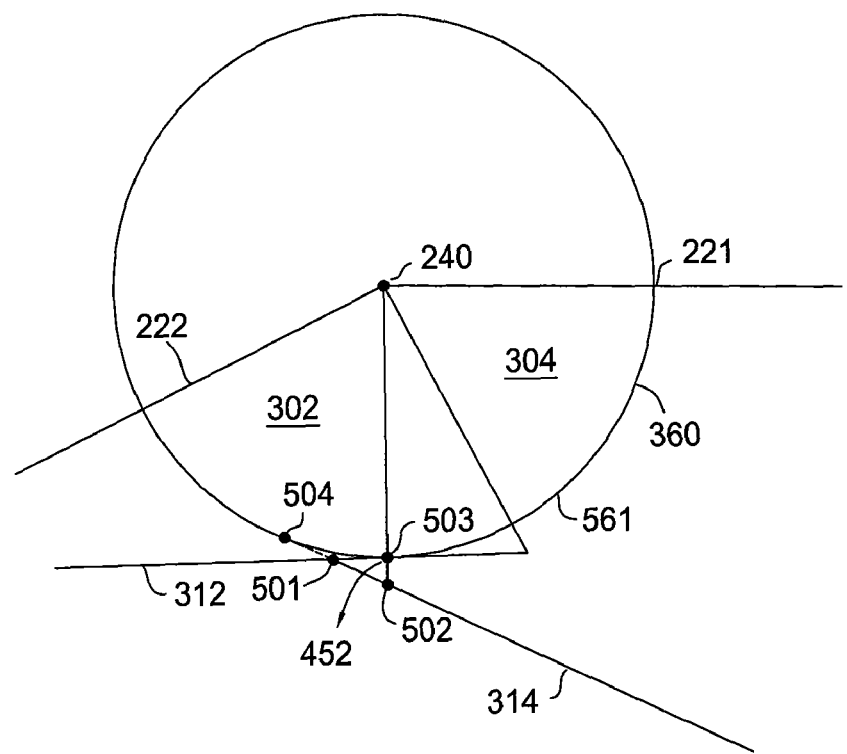
FIG. 5A-5B illustrate the connection of two daylight lines along an inside corner, according to one embodiment of the invention.

FIG. 5A illustrates a portion of the grading transition shown in FIGS. 2 and 3, according to one embodiment of the invention. More specifically, FIG. 5A shows a smooth connection between daylight lines 312 and 314 used to define the grading transition along an inside corner of footprint 220. Here, daylight lines generated for the inside corner of two footprint segments may be connected by extending one of the daylight lines until it is tangent with a circle centered at the bend point of the footprint.

For example, circle 360 is shown centered on bend point 240, with a radius determined based on the distance transition rate. As illustrated, circle 360 is tangent with daylight line 312 at point 503. Daylight line 314 may be extended from point 502 to point 504 to make a tangent connection with arc 561. The extension of daylight line 314 results in an intersection between daylight lines 312 and 314 at point 501. In one embodiment, this intersection point is selected as the connection point between daylight lines 312 and 324. By selecting this point as the bend point for an inside corner, jagged edge 362 may be eliminated from the grading transition, producing a smooth connection between daylight lines 312 and 314. Further, when displayed as part of a CAD drawing, generating the daylight lines in this fashion provides a realistic view of the grading transition.

Figure 5B:
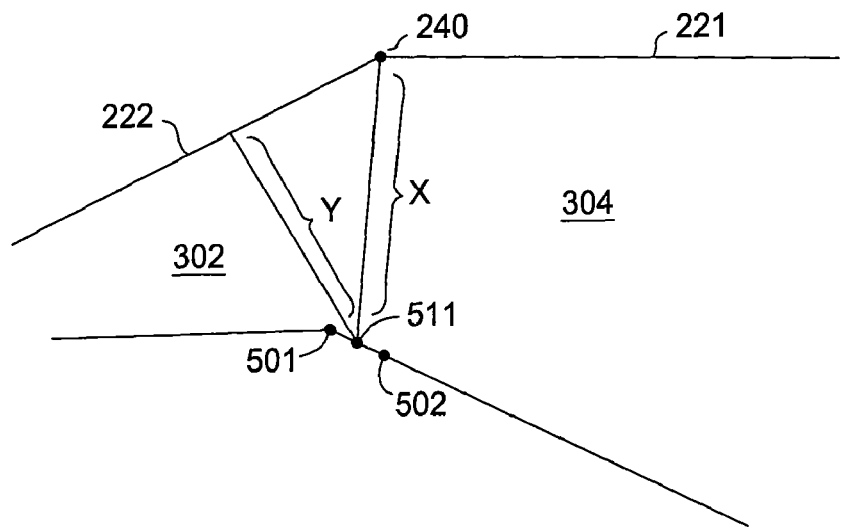

FIG. 5B illustrates this connection for daylight lines 312 and 314 of FIG. 5A after being modified to produce an extended line segment connecting a point 501 and a point 502. Once the daylight lines are defined for a grading transition, elevations may be assigned to stations along the daylight lines based on digital terrain model 122. Elevations may be determined based on the elevation of the footprint, the slope of the grading specified by the grading criteria, and on the calculated distance to the daylight line.

For example, FIG. 5B shows overlapping tiles 302 and 304. The distance and slope from the footprint line to point 511 may be determined by the distance between point 511 and the daylight lines 221 and 222. As previously discussed, the elevation at a station on daylight line 221 and 22 may be determined using a sloping criteria, for example, a 5:1 slope. However, the distance x, between point 511 and daylight line 221, may be different from the distance y between point 511 and daylight line 222, even though each line is perpendicular to one of footprint segments 221 and 223. Therefore, the slope calculated from the respective daylight lines to point 511 may be different.

Accordingly, in one embodiment, the slope from a daylight line to a point in an overlapped region may be determined by an average of the sloping criteria determined from each daylight line. For example, the elevation of point 511, as determined by daylight line 221 may be 2 feet. However, the elevation of point 511, as determined by daylight line 222 may be 4 feet. Therefore, averaging the two elevation values, the elevation of point 511 may be determined to be (2+4)/2=3 feet. One skilled in the art will recognize that embodiments of the invention are not limited to averaging the elevation as discussed above. More generally, any reasonable method for resolving differences in construction criteria may be used. For example, the average may be calculated using weights, wherein the criteria from a first footprint line are given more weight than the criteria from a second footprint line.

Figure 6:
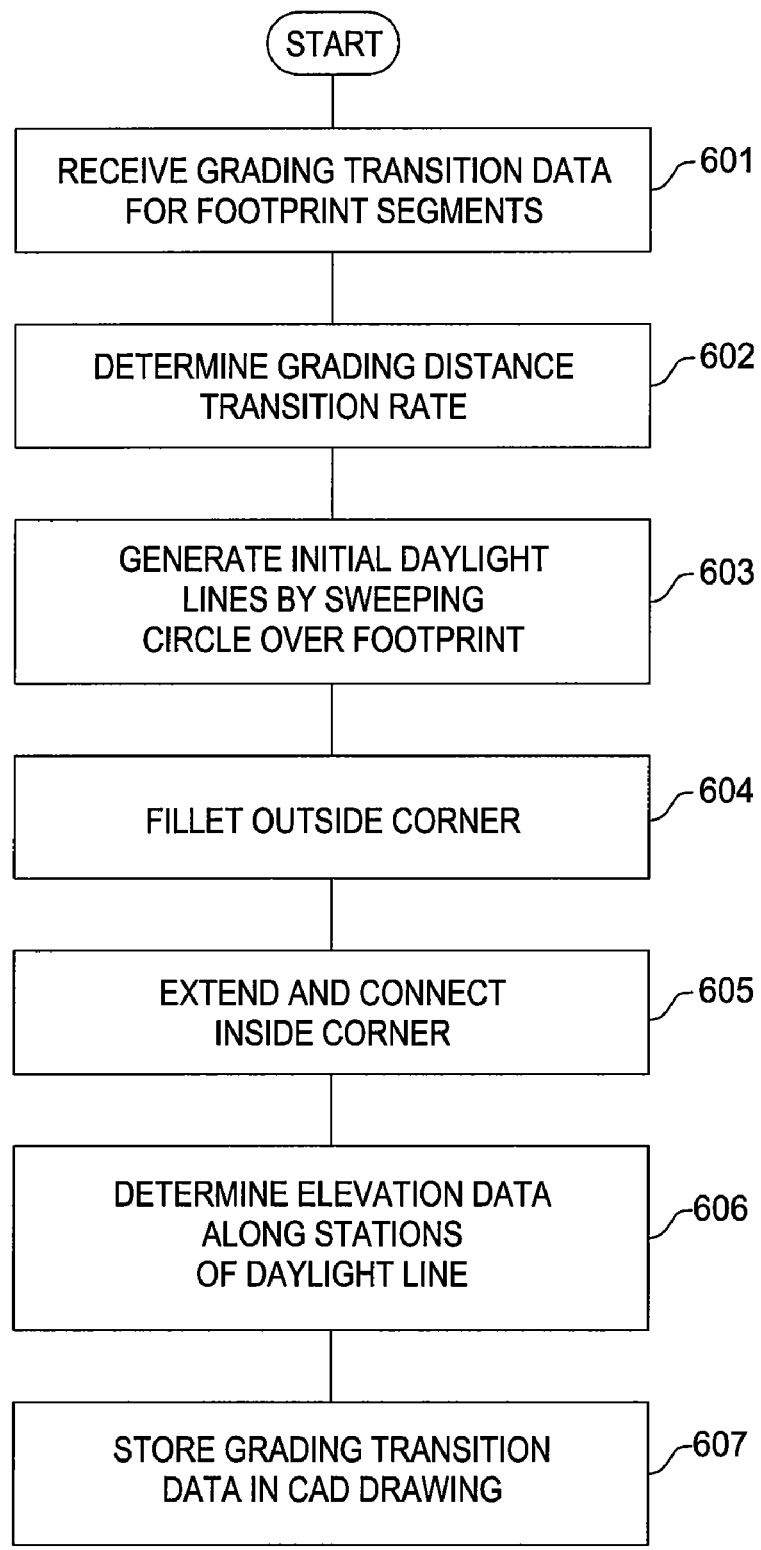
FIG. 6 illustrates a method for generating a grading transition in a CAD drawing, according to one embodiment of the invention.

FIG. 6 illustrates a method 600 for generating a grading transition in a CAD drawing, according to one embodiment of the invention. Persons skilled in the art will understand that any system configured to perform the steps of method 600, in any order, is within the scope of the present invention.

The method begins at step 601 where the grading transition data and footprint segments are received by grading tool 112. In one embodiment, the footprint segment may include one or more linear segments representing an edge of a graded surface. Additionally, grading criteria may specify an initial grading distance and an ending grading distance to use in generating a grading transition. At step 602, a grading transition rate may be determined from the initial grading distance and an ending grading distance, and length of the footprint segments received at step 601. The grading transition rate specifies a rate at which grading criteria is transitioned from initial grading distance to the ending grading distance. At step 603, daylight lines may be generated based on the grading transition data received at step 601 and the grading transition rate determined at step 602.

At step 604, CAD application 105 may fillet a connection between two segments of the daylight line that form an outside corner (e.g., the fillet 451 shown in FIG. 4). At step 605, the daylight lines generated for adjacent segments of a footprint may be extended to intersect at a point tangent to the circle as it is swept across the inside daylight line (e.g., the smooth connection between daylight lines 412 and 414 shown in FIGS. 5A-5B). Subsequently, after the modified daylight lines generated at step 606 and 607 are completed, elevation data at stations of the modified daylight line may be determined. And at step 607, the grading transition data (i.e., the modified daylight line and the elevation data) may be stored as part of the CAD drawing.

Advantageously, embodiments of the invention may be used to generate generating a CAD drawing that includes realistic grading transitions, both in terms of a visual appearance and in terms of volumetric calculations related to the excavation/fill of grading materials. Thus, visual models more accurately depict civil engineering projects, and costs estimates for creating graded surfaces may be calculated more accurately. Further, although described relative to grading transitions with different starting and ending criteria, embodiments of the invention may also be used to generate grading data even if the defined region is not in a transition (i.e. the starting and ending criteria are the same). Thus, the same methods may be used to create grading data for both regions that are, and regions that are not, in transition, rather than using a different method for each type of grading.

While the foregoing is directed to embodiments of the present invention, other embodiments of the invention may be devised without departing from the basic scope thereof, and the scope thereof is determined by the claims that follow.

What is claimed is:

1. A method for generating a three-dimensional (3D) model of a grading transition, comprising:
receiving grading transition data specifying a footprint, an initial grading distance, and an ending grading distance, wherein the footprint includes a first segment and a second segment connected at a bend point;
determining a grading distance transition rate using the initial grading distance and the ending grading distance;
generating daylight lines having smooth transitions above and below the bend point by sweeping a circle along the footprint, wherein the radius of the circle increases according to the grading distance transition rate, and wherein the circle is centered on the footprint;
assigning elevation values to stations along the daylight lines; and
storing the elevation values and the daylight lines in a memory as part of a computer aided design (CAD) drawing that models real-world objects.

2. The method of claim 1, wherein the footprint includes an outside corner connecting the first segment and the second segment connected at the bend point, and wherein the step of generating the daylight lines comprises:
generating a first daylight line corresponding to the first segment, wherein an endpoint of the first daylight line is tangent to the circle when the circle is centered at the bend point;

generating a second daylight line corresponding to the second segment, wherein an endpoint of the second daylight line is tangent to the circle when the circle is centered at the bend point; and filleting the first and second endpoints to connect the first daylight line and the second daylight line and smooth the transition above the bend point.

3. The method of claim 1, wherein the footprint includes an inside corner connecting the first segment and the second segment connected at the bend point, and wherein the step of generating the daylight lines comprises:

generating a first daylight line corresponding to the first segment, wherein the first daylight line includes a point tangent to the circle when the circle is centered at the bend point;

generating a second daylight line corresponding to the second segment; and extending the second daylight line until it intersects with a point tangent to the circle when the circle is centered at the bend point to smooth the transition below the bend point.

4. The method of claim 1, wherein the daylight lines represent locations at which a graded surface intersects an existing ground of a digital terrain model.

5. The method of claim 1, wherein the step of assigning an elevation value to the bend point comprises averaging elevation values generated for the bend point using the first segment and the second segment.

6. The method of claim 1, wherein the 3D model of a grading transition is used to calculate excavation/fill requirements necessary to create the grading transition, based on a digital terrain model.

7. The method of claim 6, wherein the 3D model of a grading transition represents a grading requirement of a civil engineering project.

8. The method of claim 1, wherein the grading transition data further includes a grading slope, and wherein the elevation values are assigned to stations along the daylight lines based on the radius of the circle measured perpendicular to the footprint and the grading slope specified by grading transition data.

9. A computer-readable medium containing a program which when executed by a processor, performs operations for generating a three-dimensional (3D) model of a grading transition, the operations comprising:

receiving grading transition data specifying a footprint, an initial grading distance, and an ending grading distance, wherein the footprint includes a first segment and a second segment connected at a bend point;

determining a grading distance transition rate using the initial grading distance and the ending grading distance;

generating daylight lines having smooth transitions above and below the bend point by sweeping a circle along the footprint, wherein the radius of the circle increases according to the grading distance transition rate, and wherein the circle is centered on the footprint; and assigning elevation values to stations along the daylight lines.

10. The computer-readable medium of claim 9, wherein the footprint includes an outside corner connecting the first segment and the second segment connected at the bend point, and wherein generating the daylight lines comprises:

generating a first daylight line corresponding to the first segment, wherein an endpoint of the first daylight line is tangent to the circle when the circle is centered at the bend point;

generating a second daylight line corresponding to the second segment, wherein an endpoint of the second daylight line is tangent to the circle when the circle is centered at the bend point; and filleting the first and second endpoints to connect the first daylight line and the second daylight line to smooth the transition above the bend point.

11. The computer-readable medium of claim 9, wherein the footprint includes an inside corner connecting the first segment and the second segment connected at the bend point, and wherein generating the daylight lines comprises:

generating a first daylight line corresponding to the first segment, wherein the first daylight line includes a point tangent to the circle when the circle is centered at the bend point;

generating a second daylight line corresponding to the second segment; and extending the second daylight line until it intersects with a point tangent to the circle when the circle is centered at the bend point to smooth the transition below the bend point.

12. The computer-readable medium of claim 9, wherein the daylight lines represent locations at which a graded surface intersects an existing ground of a digital terrain model.

13. The computer-readable medium of claim 9, wherein assigning an elevation value to the bend point comprises averaging elevation values generated for the bend point using the first segment and the second segment.

14. The computer-readable medium of claim 9, wherein the 3D model of a grading transition is used to calculate excavation/fill requirements necessary to create the grading transition, based on a digital terrain model.

15. The computer-readable medium of claim 14, wherein the 3D model of a grading transition represents a grading requirement of a civil engineering project.

16. The computer-readable medium of claim 9, wherein the grading transition data further includes a grading slope, and wherein the elevation values are assigned to stations along the daylight lines based on the radius of the circle measured perpendicular to the footprint and the grading slope specified by grading transition data.

17. A method for generating a three-dimensional (3D) model of a grading transition, comprising:

supplying grading transition data specifying a footprint, an initial grading distance, and an ending grading distance, wherein the footprint includes a first segment and a second segment connected at a bend point; and invoking a grading transition tool that is configured to:

determine a grading distance transition rate using the initial grading distance and the ending grading distance, generate daylight lines having smooth transitions above and below the bend point by sweeping a circle along the footprint, wherein the radius of the circle increases according to the grading distance transition rate, and wherein the circle is centered on the footprint, and assign elevation values to stations along the daylight lines.

18. The method of claim 17, wherein the footprint includes an outside corner connecting the first segment and the second segment connected at the bend point, and wherein the grading transition tool is further configured to:

generate a first daylight line corresponding to the first segment, wherein an endpoint of the first daylight line is tangent to the circle when the circle is centered at the bend point;

generate a second daylight line corresponding to the second segment, wherein an endpoint of the second daylight line is tangent to the circle when the circle is centered at the bend point; and fillet the first and second endpoints to connect the first daylight line and the second daylight line to smooth the transition above the bend point.

19. The method of claim 17, wherein the footprint includes an inside corner connecting the first segment and the second segment connected at the bend point, and wherein the grading transition tool is further configured to:

generate a first daylight line corresponding to the first segment, wherein the first daylight line includes a point tangent to the circle when the circle is centered at the bend point;

generate a second daylight line corresponding to the second segment; and extend the second daylight line until it intersects with a point tangent to the circle when the circle is centered at the bend point to smooth the transition below the bend point.

20. The method of claim 17, wherein the daylight lines represent locations at which the graded transition intersects an existing ground of a digital terrain model.

21. The method of claim 17, wherein the grading transition tool is further configured to assign an elevation value to the bend point comprises averaging elevation values generated for the bend point using the first segment and the second segment.

22. The method of claim 17, wherein the grading transition data further includes a grading slope, and wherein the elevation values are assigned to stations along the daylight lines based on the radius of the circle measured perpendicular to the footprint and the grading slope specified by grading transition data.

* * * * *